United States Patent
Huang et al.

(10) Patent No.: US 8,767,498 B2
(45) Date of Patent: Jul. 1, 2014

(54) CIRCUIT AND METHOD FOR GENERATING A READ SIGNAL

(75) Inventors: Jiann-Tseng Huang, Hsinchu (TW); Sung-Chieh Lin, Zhubei (TW); Kuoyuan (Peter) Hsu, San Jose, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 191 days.

(21) Appl. No.: 13/285,357

(22) Filed: Oct. 31, 2011

(65) Prior Publication Data
US 2013/0107603 A1 May 2, 2013

(51) Int. Cl.
*G11C 17/14* (2006.01)

(52) U.S. Cl.
USPC .......................................... 365/225.7; 365/96

(58) Field of Classification Search
USPC ................................ 365/96, 225.7; 257/529
See application file for complete search history.

(56) References Cited

U.S. PATENT DOCUMENTS

| | | | | |
|---|---|---|---|---|
| 6,108,261 A | * | 8/2000 | Kim et al. | 365/225.7 |
| 2004/0218328 A1 | * | 11/2004 | Kuzuno et al. | 361/104 |
| 2008/0062605 A1 | * | 3/2008 | Tsai et al. | 361/104 |
| 2010/0188907 A1 | * | 7/2010 | Tsunetou | 365/189.05 |
| 2011/0273949 A1 | * | 11/2011 | Chen et al. | 365/225.7 |

* cited by examiner

*Primary Examiner* — Douglas King
(74) *Attorney, Agent, or Firm* — Lowe Hauptman & Ham, LLP

(57) ABSTRACT

A circuit includes a fuse circuit and a control circuit. The fuse circuit has an electrical fuse. The control circuit is configured to receive an input signal having an input pulse, and, based on a feedback signal from the fuse circuit, generates a read pulse smaller than the input pulse for use in reading the data stored in the electrical fuse.

24 Claims, 6 Drawing Sheets

US 8,767,498 B2

CIRCUIT AND METHOD FOR GENERATING A READ SIGNAL

FIELD

The present disclosure is related to a circuit and a method for generating a read signal.

BACKGROUND

Read access time of an electrical fuse varies depending on various factors, such as the resistance of the programmed fuse, manufacturing process, operational voltage, and temperature (collectively PVT) variations, etc. In some approaches, to cover a wide range of variations, the width of a read signal pulse and thus the read access time of the electrical fuse are loosely set. The width of the read signal, however, is proportional to the time the fuse is being subjected to an electrical stress by a read current. As a result, in some conditions, the fuse is subject to an electrical stress longer than necessary when the fuse is read. The maximum cumulative number of read accesses for the lifetime of the fuse is therefore reduced. The electrical stress is worse with a higher read voltage.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
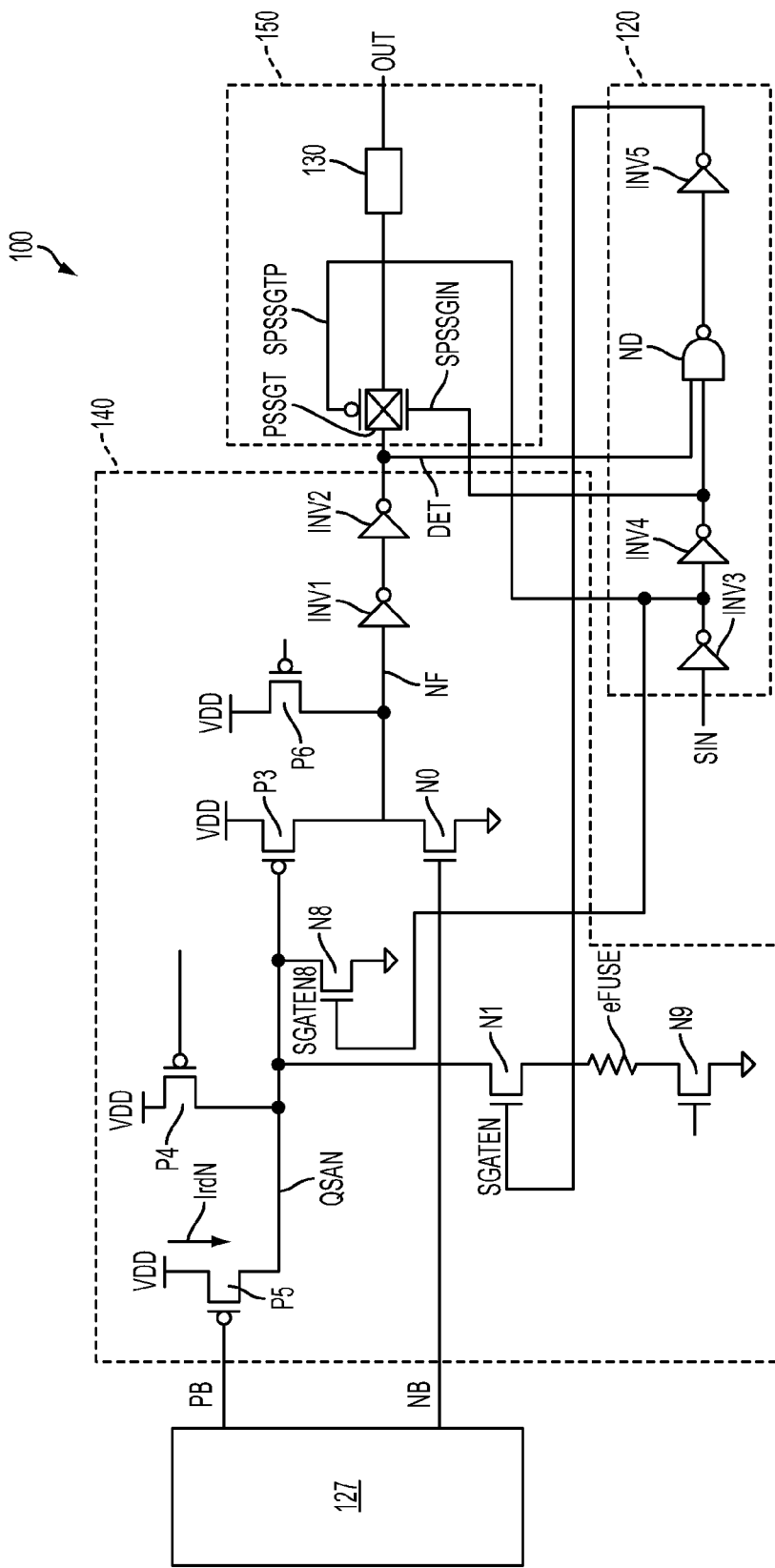
FIG. 1 is a diagram of a circuit using an electrical fuse, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. A transistor used in sensing the data for the electrical fuse (eFuse) is turned off after sensing a logical value is complete. As a result, the time the eFuse is being subjected to an electrical stress by a read current is reduced each time the eFuse is read. The maximum cumulative number of read accesses to the eFuse for the life time of the eFuse therefore increases. In some embodiments, the number increases from about 2 million to about 200 million.

Exemplary Circuit, Some Embodiments

FIG. 1 is a diagram of a circuit 100 using an electrical fuse (eFuse), in accordance with some embodiments.

Figure 2:
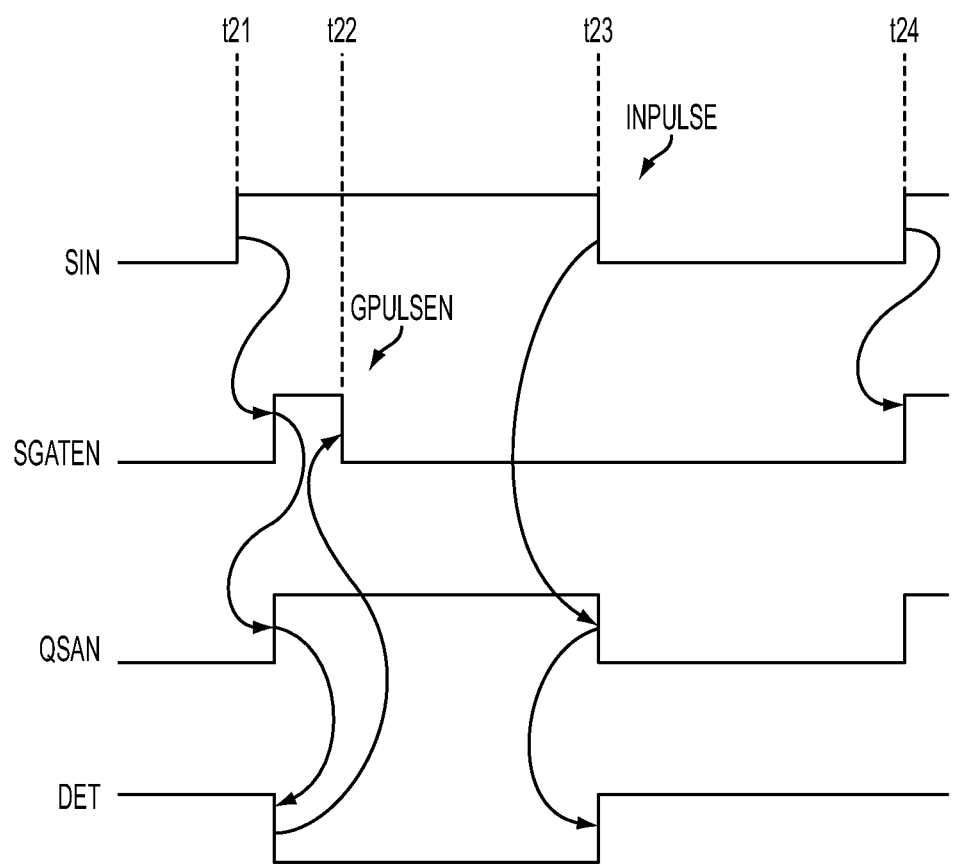
FIG. 2 is a graph of waveforms illustrating the relationship of various signals of the circuit in FIG. 1, in accordance with some embodiments.

Control circuit 120 receives a signal SIN at the input of inverter INV3, provides various signals to regulate pulse INPULSE of signal SIN, and provides a pulse GPULSEN of signal SGATEN to the gate of transistor N1. Pulse INPULSE, pulse GPULSEN, and signal SGATEN are shown in FIG. 2. Illustratively shown in FIG. 1, circuit 120 provides signal SGATEN8 to the gate of transistor N8, signal SPSSGTP to a first input of pass gate PSSGT, and signal SPSSGTN to a second input of pass gate PSSGT. Signal SGATEN8 and signal SPSSGTP are the same signal. Signal SGATEN is commonly called a read signal. In some embodiments, compared with the width of pulse INPULSE, the width of pulse GPULSEN is reduced.

Signal SIN passing through inverter INV3 results in signal SGATEN8 and signal SPSSGTP. As a result, signal SGATEN8 and signal SPSSGTP are the inverse logic of signal SIN.

Signal SGATEN8 or signal SPSSGTP passing through inverter INV4 results in signal SPSSGTN. As a result, signal SPSSGTN is the inverse logic of signal SPSSGTP, and is electrically the same as signal SIN.

Signal SPSSGTN passing through NAND gate ND and inverter INV5 results in signal SGATEN provided to the gate of transistor N1.

When signal DET at a first input of NAND gate ND is logically low, the output of NAND gate ND is logically high regardless of the logical value of signal SPSSGTN. Signal SGATEN at the output of inverter INV5 is therefore logically low. In contrast, when signal DET is logically high, signal SGATEN follows signal SPSSGTN. Effectively, when signal DET is logically high, signal SGATEN follows signal SIN.

Sense amplifier bias circuit 127 provides signals PB and NB to control PMOS transistor P5 and NMOS transistor N0, respectively. In some embodiments, signals PB and NB are active during sensing. As a result, transistors P5 and N0 are on during sensing. For example, when signal PB at the gate of PMOS transistor P5 is logically high, PMOS transistor P5 is turned off. But when signal PB is logically low during sensing, PMOS transistor P5 is turned on. When transistor P5 is turned on, transistor P5 provides a read current IrdN for use in reading the data stored in fuse eFuse. For another example, when signal NB at the gate of NMOS transistor N0 is logically low, NMOS transistor N0 is turned off, and is electrically disconnected from node NF. But when signal NB is logically high during sensing, transistor N0 is turned on. Transistors N0 and P3 regulate the logical value on node NF, which will be explained in detail below.

Fuse circuit 140 includes an electrical fuse eFuse and associated circuitry. In a read cycle, the data stored in fuse eFuse is reflected on node QSAN, node NF, node of signal DET, and output OUT. As a result, detecting a logical value at output OUT reveals the data stored in fuse eFuse or the program condition of fuse eFuse. For example, in some embodiments, when fuse eFuse is programmed, node QSAN is logically high, node NF is logically low, signal DET is logically low, and output OUT is logically high. But when fuse eFuse is not programmed, node QSAN is logically low, node NF is logically high, signal DET is logically high, and output OUT is logically low. Fuse eFuse shown in circuit 140 is for illustration. Fuse eFuse outside of circuit 140 is within the scope of various embodiments.

In some embodiments, when fuse eFuse is not programmed, the resistance of fuse eFuse is relatively low, and the voltage at node QSAN represents a logical low value. When fuse eFuse has been programmed, however, the resistance of fuse eFuse is relatively high, and the voltage at node QSAN represents a logical high value. In some embodiments, the resistance of fuse eFuse is 10 KΩ and 20 Ω when fuse eFuse is programmed and un-programmed, respectively.

Transistor N9 is used to select a fuse eFuse for reading. In some embodiments, fuse eFuse is one of a plurality of fuses in an array of electrical fuses, which, for simplicity, are not shown in FIG. 1.

Transistor N1 receives signal SGATEN having pulse GPULSEN at the gate of transistor N1. In some embodiments, pulse GPULSEN is derived from pulse INPULSE, and is a positive pulse. During the time period that pulse GPULSEN is logically high, transistor N1 is turned on so that current IrdN from transistor P5 flows through fuse eFuse for a read access. In some embodiments, the high duration of pulse GPULSEN is reduced compared with pulse INPULSE of input signal SIN. As a result, the time fuse eFuse is subjected to a read current IrdN flowing through fuse eFuse is reduced. Consequently, the maximum cumulative number NMAX (not labeled) of read access to fuse eFuse is increased for the life time of fuse eFuse. For example, in one approach, when pulse INPULSE is provided to the gate of transistor N1, the number NMAX is estimated to be about 2 million. In contrast, in various embodiments, when pulse GPULSEN is provided, the number NMAX is estimated to increase to about 200 million.

PMOS transistor P5 and NMOS transistor N8 regulate the voltage level at node QSAN or the gate of PMOS transistor P3. Transistor P5 is configured to provide a read current IrdN for use in reading fuse eFuse. A current source used in place of transistor P5 is within the scope of various embodiments. For example, in a sensing operation, transistors N1 and N9 are turned on. Transistor P5 is also turned on. As a result, current IrdN flows through fuse eFuse. In effect, PMOS transistor P5 and NMOS transistor N8 turn on and off PMOS transistor P3. For example, when PMOS transistor P5 is turned off, PMOS transistor P5 is electrically disconnected from node QSAN. But when PMOS transistor P5 is turned on, PMOS transistor P5 pulls node QSAN to voltage VDD at the source of transistor P5. As a result, PMOS transistor P3 is turned off.

When NMOS transistor N8 is turned off, NMOS transistor N8 is electrically disconnected from node QSAN. But when NMOS transistor N8 is turned on, NMOS transistor N8 pulls node QSAN to ground at the source of NMOS transistor N8. Node QSAN is also the gate of PMOS transistor P3, and is therefore at a low logical value. Effectively, when transistor N8 is on, PMOS transistor P3 is also on. In some embodiments, at the beginning of a sensing cycle, transistor N8 is turned off, and is therefore electrically disconnected from node QSAN. After the data is latched to output OUT, transistor N8 is turned on to pull node QSAN to a low logical value to turn on transistor P3. In some embodiments, PMOS transistor P5 and NMOS transistor N8 are designed such that, when signal SIN is logically high, current IrdN flows through transistor N1, fuse eFuse, and transistor N9 to ground. In contrast, when signal SIN is logically low, current IrdN flows through transistor N8 to ground.

The operational mode of PMOS transistor P3 and NMOS transistor N0 results in the data at node NF that couples the drain of transistor P3 and the drain of transistor N0. In some conditions, when both PMOS transistor P3 and NMOS transistor N0 are turned on, PMOS transistor P3 tries to pull node NF to a high logical value of voltage VDD at the source of transistor P3. In contrast, NMOS transistor N0 tries to pull node NF to a low logical value or ground at the source of transistor N0. In some embodiments, transistor P3 is designed to have a driving capability stronger than that of transistor N0. As a result, when both transistors P3 and N0 try to pull node NF, transistor P3 prevails. That is, transistor P3 pulls node NF to the high logical value at the source of transistor P3, instead of transistor N0 pulling node NF to the low logical value at the source of transistor N0.

Inverters INV1 and INV2 serve as buffers for the signal on node NF. Signal DET is the result of the signal on node NF passing through two inverters INV1 and INV2. As a result, signal DET is electrically the same as the signal on node NF. Signal DET is called a feedback signal for control circuit 120 because control circuit 120 uses signal DET to control the width of pulse GPULSEN.

In some embodiments, transistors P4 and P6 are turned on and turned off at the same time. When the chip having fuse eFuse is in the standby mode, transistors P4 and P6 are turned on to reduce the leakage current in circuit 100. During sensing, however, transistors P4 and P6 are turned off, and have no electrical effect on circuit 100.

Output circuit 150 processes signal DET and provides the result on output OUT that reflects the data stored in fuse eFuse. Effectively, the data on output OUT reflects the program condition of fuse eFuse. For example, when the data stored in fuse eFuse is reflected on signal DET through node QSAN and node NF, pass gate PSSGT is turned on to transfer signal DET to the output of pass gate PSSGT for latch 130 to latch the data to output OUT. In some embodiments, latch 130 includes an inverter inverting signal DET to provide the signal on output OUT. Effectively, when fuse eFuse stores a logical high value, signal DET is logically low, and output OUT has a logical high value. But when fuse eFuse stores a logical low value, signal DET is logically high, output OUT has a logical low value. Various circuit components of circuit 150 or the whole circuit 150 being a part of circuit 140 and/or other circuits in FIG. 1 are within the scope of various embodiments.

Exemplary Waveforms

FIG. 2 is a graph of waveforms illustrating the relationship of various signals in a read operation of circuit 100, in accordance with some embodiments. Signals SGATEN8 and the signal on node NF are described, but, for simplicity, the waveform of signal SGATEN8 and the waveform of the signal on node NF are not shown. The operations of circuit 100 that generate the waveforms in FIG. 2 are described in detail with reference to method 300 in FIG. 3.

Before time t21, signal SIN is logically low. As a result, signal SGATEN8 is logically high, node QSAN is logically low, node NF is logically high, and signal DET is logically high. Because signal DET is logically high, signal SGATEN follows signal SIN, and is therefore logically low.

At time t21, signal SGATEN rises in response to the rising edge of signal SIN. As a result, transistor N1 is turned on, causing node QSAN to be logically high, which causes node NF to be logically low, and signal DET to be logically low.

At time t22, signal SGATEN falls in response to signal DET falling low. Pulse GPULSEN is thus created.

At time t23, pulse INPULSE ends. Alternatively stated, signal SIN falls. Consequently, signal SGATEN8 is logically high, and signal QSAN is logically low, which forces signal DET to be logically high. As a result, signal SGATEN follows signal SIN. Explained in a different way, signal SGATEN continues to be logically low while signal SIN is logically low.

At time t24, signal SIN rises, starting a new rising edge for pulse INPULSE for the next cycle. Signal SGATEN also rises in response to signal SIN rising when signal DET is logically high. Time t24 corresponds to time t21 for the next cycle.

In the above illustration, compared with the width of pulse INPULSE, the width of pulse GPULSEN is reduced. Consequently, fuse eFuse is subjected to a shorter time being stressed by the read current IrdN each time fuse eFuse is read. The number NMAX therefore increases. As a result, embodiments of the disclosure are advantageous over other approaches in which the pulse applied at the gate of transistor N1 is as wide as pulse INPULSE. Fuse eFuse in those approaches is thus subjected to a longer electrical stress by the read current IrdN.

Exemplary Method

Figure 3:
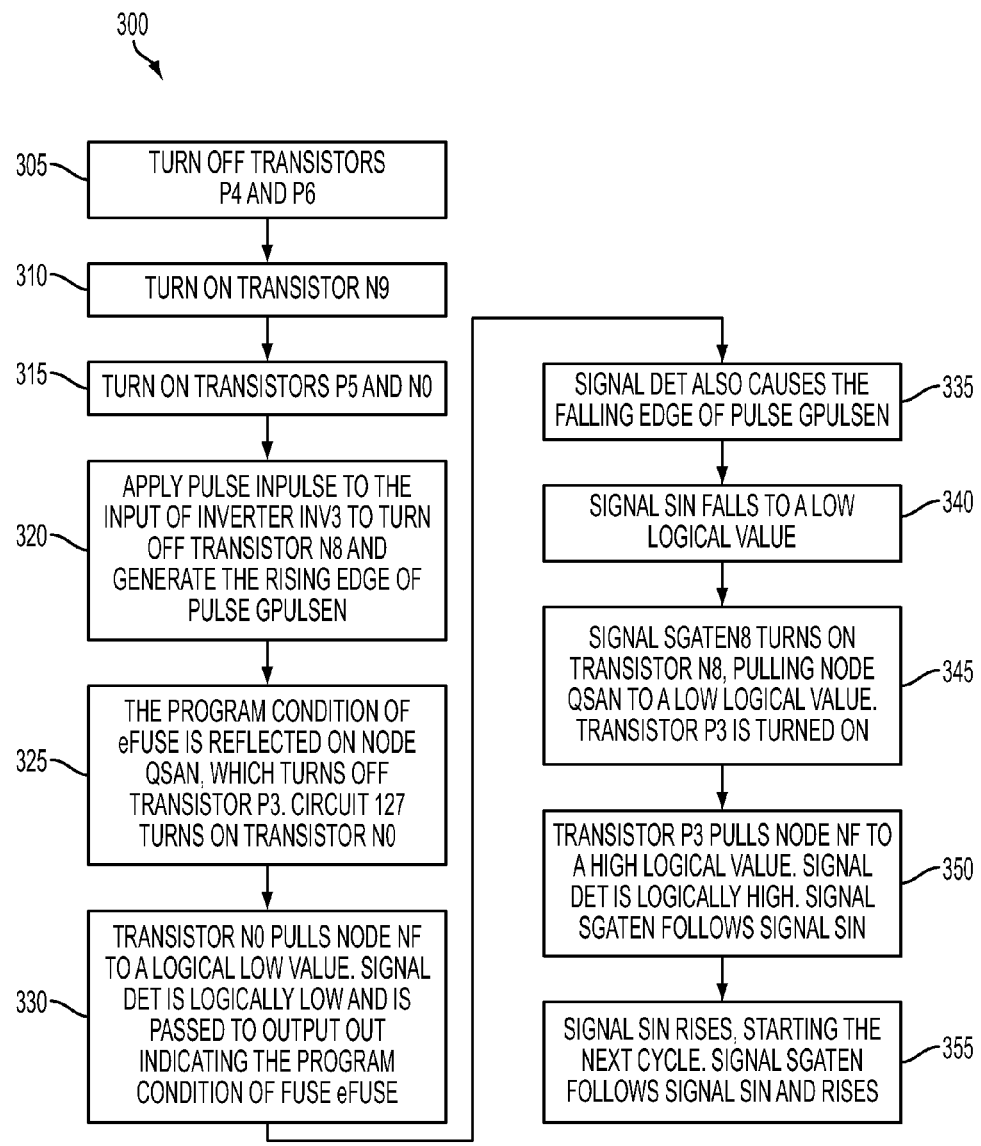
FIG. 3 is a flowchart of a method illustrating an operation of the circuit in FIG. 1, in accordance with some embodiments.

FIG. 3 is a flowchart of a method 300 illustrating operations of circuit 100, in accordance with some embodiments. For illustration, fuse eFuse has been programmed. Alternatively stated, fuse eFuse stores a logical high value. In this illustration, fuse eFuse is read. Various operations in FIG. 3 correspond to the waveforms illustratively shown in FIG. 2.

Initially, before time t21 in FIG. 2, signal SIN is logically low, and passes through inverter INV3. As a result, signal SGATEN8 is logically high. Transistor N8 is on, which pulls node QSAN to a logical low value. Consequently, transistor P3 is on, node NF is logically high, and node DET is logically high.

In operation 305, transistors P4 and P6 are turned off, and therefore have no electrical effect on node QSAN and node NF, respectively.

In operation 310, transistor N9 is turned on to select fuse eFuse to be read.

In operation 315, circuit 127 provides signals PB and NB to turn on transistors P5 and N0, respectively. Transistor P5 is turned on to generate current IrdN to be flowed through fuse eFuse for reading. Transistor N0 is turned on to regulate the logical value at node NF.

In operation 320 corresponding to time t21, signal SIN having a positive pulse INPULSE is applied at the input of inverter INV3. At that time, signal DET has a high logical value. As a result, signal SGATEN follows signal SIN. Effectively, the rising edge of pulse GPULSEN is created based on the rising edge of pulse INPULSE. Further, a logical high value is applied at the gate of transistor N1. Consequently, transistor N1 is turned on. The rising edge of pulse INPULSE also results in signal SGATEN8 being logically low that turns off transistor N8.

In operation 325, in response to transistor N1 being turned on, node QSAN at the drain of transistor N1 is logically high, which indicates that fuse eFuse has been programmed. Node QSAN is also the gate of PMOS transistor P3. As a result, PMOS transistor P3 is turned off. At the same time, NMOS transistor N0 has been turned on.

In operation 330, transistor N0 being on pulls node NF to ground or a low logical value at the source of transistor N0. Effectively, signal DET at time t22 also falls to a logical low value like node NF. At that time, signal SPSSGTP and signal SPSSGTN at the inputs of pass gate PSSGT are logically low and logically high, respectively. As a result, pass gate PSSGT is turned on. Signal DET passes through pass gate PSSGT, and is latched by latch 130 to output OUT. In some embodiments, latch 130 latches the inverse logical value of signal DET to generate a logical high value at output OUT.

In operation 335, the output of NAND gate ND is logically high because signal DET at one input of NAND gate ND is logically low. As a result, signal SGATEN at the output of inverter INV5 is forced to a low logical value. Effectively, the falling edge of signal SGATEN and thus pulse GPULSEN are created. Further, transistor N1 is off and has no electrical effect on node QSAN.

Explained in a different way, transistor N1 is off and has no electrical effect on node QSAN soon after the data of fuse eFuse is read in operation 330. Consequently, fuse eFuse is no longer subjected to the read current IrdN even though the read cycle for fuse eFuse continues.

The following operations illustrate how signal SGATEN remains at the low logical value until the next read cycle when signal SIN rises from a low logical value to a high logical value. In other words, signal SGATEN remains at the low logical value until another pulse INPULSE is applied at the input of inverter INV3 for another cycle.

In operation 340 corresponding to time t23 in FIG. 2, signal SIN falls to a low logical value. As a result, signal SGATEN8 rises to a high logical value, and NMOS transistor N8 is turned on.

In operation 345, transistor N8 being on pulls node QSAN at the gate of PMOS transistor P3 to a low logical value. PMOS transistor P3 is therefore turned on.

In operation 350, transistor P3 pulls node NF to a high logical value at the source of transistor P3. As a result, signal DET is logically high. Signal SGATEN therefore follows signal SIN, which is logically low at that time. Effectively, signal SGATEN remains logically low until signal SGATEN rises in response to signal SIN rising again for the next cycle.

In operation 355 corresponding to time t24 in FIG. 2, when read signal SIN rises for the next read cycle, signal SGATEN rises. Operation 355 thus corresponds to operation 320 for the next read cycle of fuse eFuse.

Exemplary Circuit, Some Further Embodiments

Figure 4:
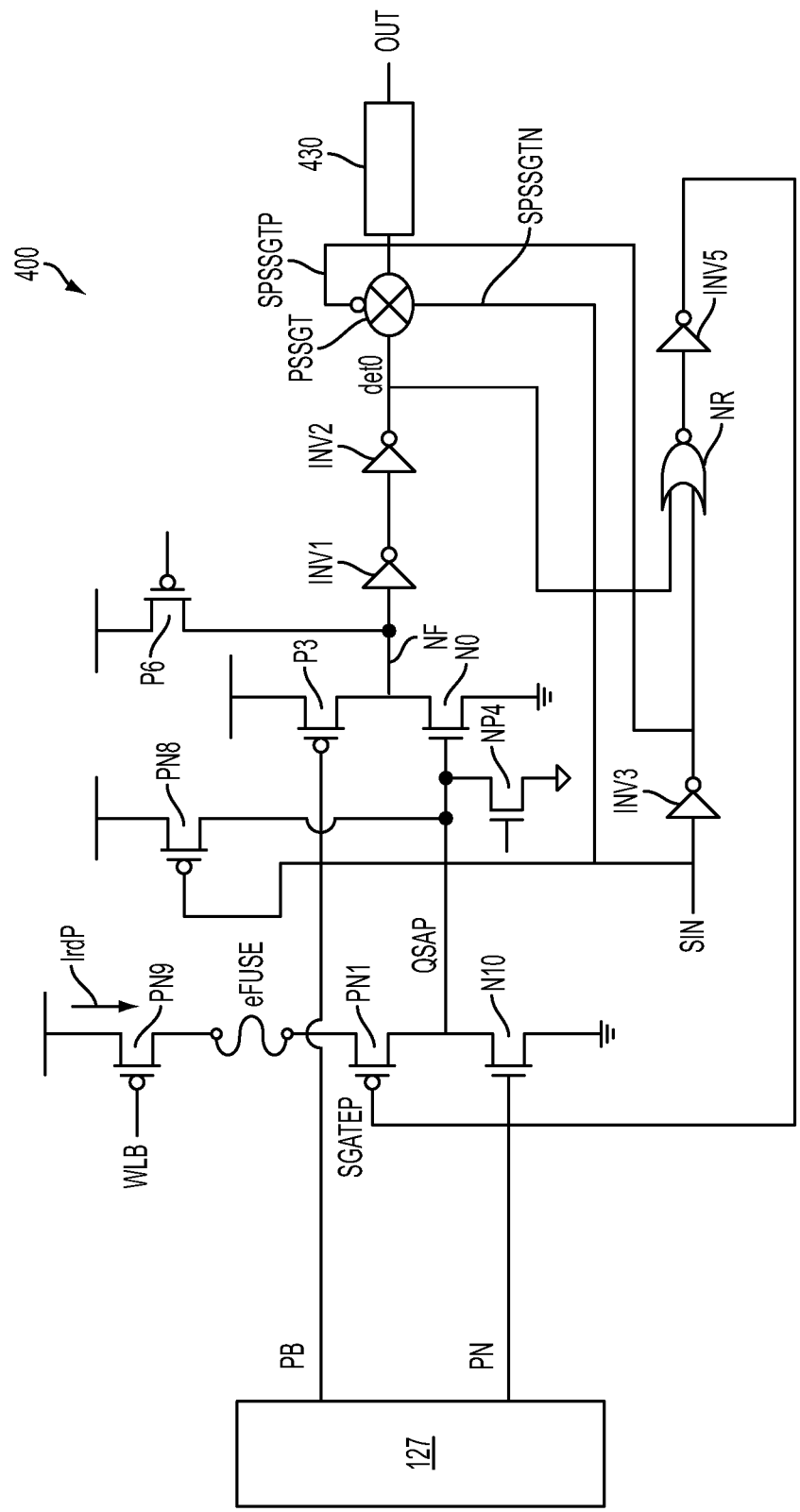
FIG. 4 is a diagram of a circuit using an electrical fuse, in accordance with some further embodiments.

FIG. 4 is a diagram of a circuit 400, in accordance with some embodiments. Compared with circuit 100, PMOS transistor PN1 replaces NMOS transistor N1 in FIG. 1. As a result, various other circuit elements in circuit 100 have been modified to function with a PMOS transistor PN1, instead of an NMOS transistor N1. For example, node QSAP at the source of PMOS transistor PN1 corresponds to node QSAN in FIG. 1. Node QSAP is also at the drain of transistor N10 that is newly added to FIG. 4. NMOS transistor N10 serves as a current path for current IrdP that corresponds to current IrdN in circuit 100. PMOS transistor PN9 replaces NMOS transistor N9. The source of PMOS transistor PN9 receives operational voltage VDD. PMOS transistor PN9 and electrical fuse eFuse are coupled to PMOS transistor PN1. There is no transistor P5, but transistor PN9 also provides the read current IrdP, and is used for reading the data stored in fuse eFuse. PMOS transistor PN8 replaces NMOS transistor N8 in FIG. 1, and is used to pull up node QSAP. Inverter INV3 has been eliminated. Signal SIN controls the gate of PMOS transistor PN8, and is also fed to the input of inverter INV4. Signal SGATEPN8 (not labeled) provided to the gate of transistor PN8 is electrically the same as signal SIN. Signal SPSSGTN provided to a first input of pass gate PSSGT is the same as signal SGATEPN8. Signal SPSSGTP provided to a second input of pass gate PSSGT is at the output of inverter INV4. NOR gate NR replaces NAND gate ND. NMOS transistor NP4 replaces PMOS transistor P4. Latch 430 replaces latch 130. Latch 130 latches the inverse logical value of signal DET to indicate the program condition of fuse eFuse, while latch 430 latches the logical value of signal DET to indicate the program condition of fuse eFuse.

In some situations when transistors PN9, PN1, and N10 are on, and fuse eFuse is not programmed, PMOS transistor PN9 tries to pull node QSAP to operational voltage VDD at the source of transistor PN9. In contrast, NMOS transistor N10 tries to pull node QSAP to ground at the source of transistor N10. In some embodiments, transistor PN9 is designed to have a driving capability stronger than that of transistor N10. As a result, node QSAP is pulled to a logical high value at the source of PMOS transistor PN9, instead of being pulled down to ground at the source of NMOS transistor N10.

Functionally, in FIG. 4, signal SGATEP received at PMOS transistor PN1 is an inverse logical value of signal SIN. Explained differently, pulse GPLULSEP (shown in FIG. 5) that corresponds to pulse GPULSEN is a negative pulse. As a result, PMOS transistor PN1 is on during the low duration of pulse GPULSEP. Further, when signal DET is logically low, signal SGATEP is the inverse logic of signal SIN. But when signal DET is logically high, signal DET is forced to a logical high value.

Exemplary Waveforms

Figure 5:
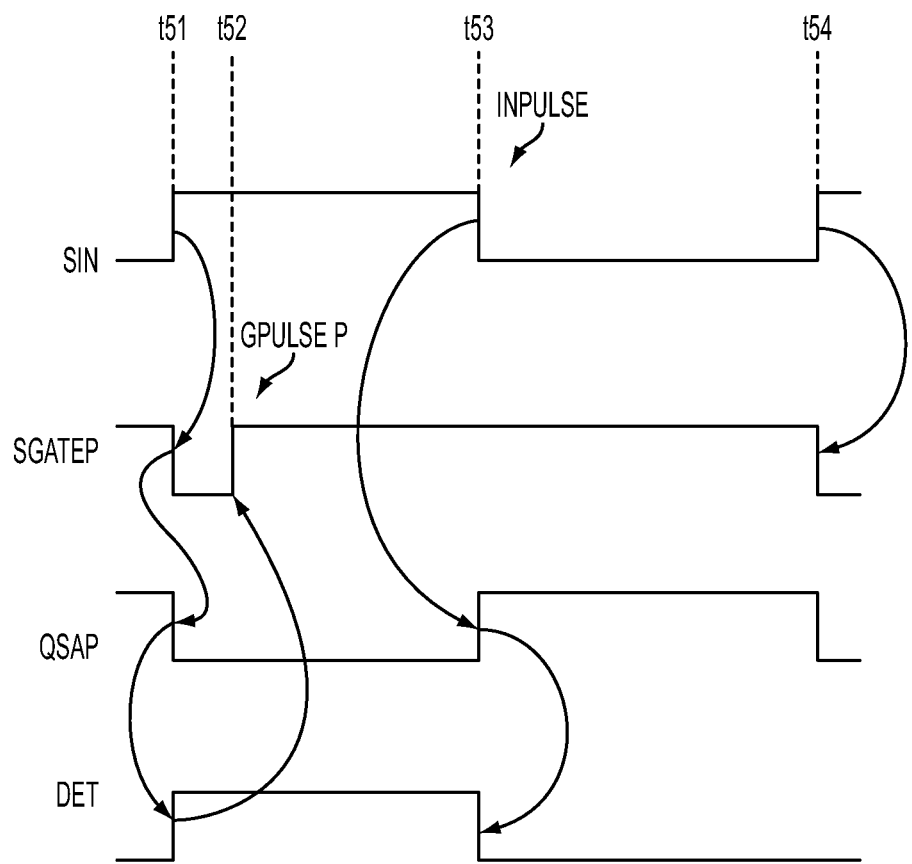
FIG. 5 is a graph of waveforms illustrating the relationship of various signals of the circuit in FIG. 4, in accordance with some embodiments.

FIG. 5 is a graph of waveforms illustrating the relationship of various signals in a read operation of circuit 400, in accordance with some embodiments. Signals SGATEPN8 and the signal on node NF are described, but, for simplicity, the waveform of signal SGATEPN8 and the waveform of the signal on node NF are not shown. The operations of circuit 400 that generate the waveforms in FIG. 5 are described in detail with reference to method 600 in FIG. 6.

Before time t51, signal SIN is logically low. As a result, signal SGATEPN8 is logically low, node QSAP is logically high, node NF is logically low, and signal DET is logically low. Because signal DET is logically low, signal SGATEP is the inverse logic of signal SIN, and is therefore logically high.

At time t51, signal SGATEP falls in response to the rising edge of signal SIN. As a result, transistor PN1 is turned on, causing node QSAP to be logically low, which will be explained in detail with reference to FIG. 6. Node QSAP being logically low causes node NF to be logically high, and signal DET to be logically high.

At time t52, signal SGATEP rises in response to signal DET rising high. Pulse GPULSEP is thus created.

At time t53, pulse INPULSE ends. Alternatively stated, signal SIN falls. Consequently, signal SGATENP8 is logically low, and signal QSAP is logically high, which forces signal DET to be logically low. As a result, signal SGATEP follows the inverse logic of signal SIN. Explained in a different way, signal SGATEP continues to be logically high while signal SIN is logically low.

At time t54, signal SIN rises, starting a new rising edge for pulse INPULSE for the next cycle. Signal SGATEP falls in response to signal SIN rising when signal DET is logically low. Time t54 corresponds to time t51 for the next cycle.

In the above illustration with reference to FIG. 5, compared with the width of positive pulse INPULSE, the width of negative pulse GPULSEP is reduced. Consequently, fuse eFuse is subjected to a shorter time being stressed by the read current IrdP each time fuse eFuse is read. The number NMAX therefore increases. As a result, embodiments of the disclosure are advantageous over other approaches in which the pulse applied at the gate of transistor PN1 is as wide as the inverse of pulse INPULSE. Fuse eFuse in those approaches is thus subjected to a longer electrical stress by the read current IrdP.

Exemplary Method

Figure 6:
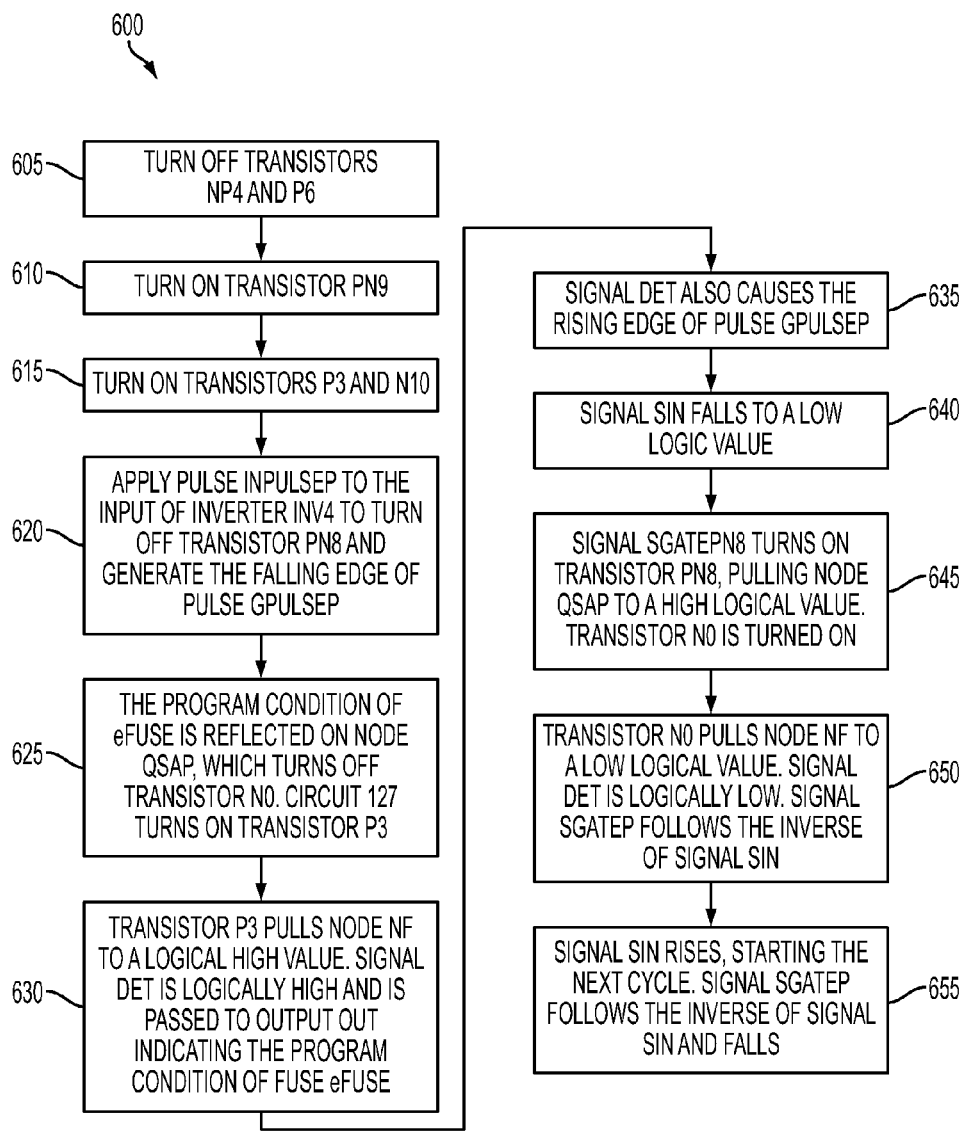
FIG. 6 is a flowchart of a method illustrating an operation of the circuit in FIG. 4, in accordance with some embodiments.

FIG. 6 is a flowchart of a method 600 illustrating operations of circuit 400, in accordance with some embodiments. For illustration, fuse eFuse has been programmed. Alternatively stated, fuse eFuse stores a logical high value. In this illustration, fuse eFuse is read. Various operations in FIG. 6 correspond to the waveforms illustratively shown in FIG. 5.

Initially, before time t51 circuit 127 provides a signal to turn off transistor N10. Transistor PN1 is off. Signal SIN is logically low. As a result, signal SGATEPN8 is logically low. Transistor PN8 is on, which pulls node QSAP to a logical high value. Consequently, NMOS transistor N0 is on, which pulls node NF to a logical low value. Signal DET is therefore logically low.

In operation 605, transistors NP4 and P6 are turned off, and therefore have no electrical effect on node QSAP and node NF, respectively.

In operation 610, transistor PN9 is turned on to select fuse eFuse to be read.

In operation 615, circuit 127 provides signals PB and NB to turn on transistors P3 and N10, respectively. Transistor N10 is turned on to serve as a current path for current IrdP to flow through fuse eFuse for reading. Transistor P3 is turned on to regulate the logical value at node NF.

In operation 620 corresponding to time t51 in FIG. 5, signal SIN having a positive pulse INPULSE is applied at the input of inverter INV4. At that time, signal DET has a logical low value. As a result, signal SGATEP follows the inverse logic of signal SIN. Effectively, the falling edge of pulse GPULSEP is created based on the rising edge of pulse INPULSE. Further, a logical low value is applied at the gate of transistor PN1. Consequently, transistor PN1 is turned on. Because fuse eFuse is programmed, fuse eFuse has a high impedance, and is considered as an open circuit. Circuit 127 provides signal NB having a logical high value to turn on transistor N10. Transistor N10 thus pulls node QSAP to a low logical value at the source of transistor N10.

The rising edge of pulse INPULSE also results in signal SGATEPN8 being logically high, which turns off transistor PNB.

In operation 625, in response to transistor PN1 being turned on, node QSAP at the source of transistor PN1 is logically low, which indicates that fuse eFuse has been programmed. Node QSAP is also coupled to the gate of NMOS transistor N0. As a result, NMOS transistor N0 is turned off. At the same time, PMOS transistor P3 has been on.

In operation 630, transistor P3 being on pulls node NF to operational voltage VDD or a high logical value at the source of transistor P3. Effectively, signal DET also rises to a logical high value like node NF, which corresponds to time t52 in FIG. 5. At that time, signal SPSSGTP and signal SPSSGTN at the inputs of pass gate PSSGT are logically low and logically high, respectively. As a result, pass gate PSSGT is turned on. Signal DET passes through pass gate PSSGT, and is latched by latch 430 to output OUT.

In operation 635, the output of NOR gate NR is logically low because signal DET at one input of NOR gate NR is logically high. As a result, signal SGATEP at the output of inverter INV5 is forced to a logical high value. Effectively, the rising edge of signal SGATEP and thus pulse GPULSEP are created. Further, transistor PN1 is off and has no electrical effect on node QSAP.

Explained in a different way, transistor PN1 is off and has no electrical effect on node QSAP soon after the data of fuse eFuse is read in operation 630. Consequently, fuse eFuse is no longer subject to the read current IrdP even though the read cycle for fuse eFuse continues.

The following operations illustrate how signal SGATEP remains at the high logical value until the next read cycle when signal SIN rises from a low logical value to a high logical value. In other words, signal SGATEP remains at the high logical value until another pulse INPULSE is applied at the input of inverter INV4 for another cycle.

In operation 640 corresponding to time t53 in FIG. 5, signal SIN falls to a low logical value. As a result, signal SGATEPN8 also falls, and PMOS transistor PN8 is turned on.

In operation 645, PMOS transistor PN8 being on pulls node QSAP at the gate of NMOS transistor N0 to a high logical value. NMOS transistor N0 is therefore turned on.

In operation 650, transistor N0 pulls node NF to a low logical value at the source of transistor N0. As a result, signal DET is logically low. Signal SGATEP therefore follows the inverse logic of signal SIN, which is logically low at that time. Consequently, signal SGATEP is logically high. Effectively, signal SGATEP remains logically high until signal SGATEP falls in response to signal SIN rising again for the next cycle.

In operation 655 corresponding to time t54 in FIG. 5, when read signal SIN rises for the next read cycle, signal SGATEP falls. Operation 655 thus corresponds to operation 620 for the next read cycle of fuse eFuse.

A number of embodiments have been described. It will nevertheless be understood that various modifications may be made without departing from the spirit and scope of the disclosure. For example, the various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logical value (e.g., Low or High) of various signals used in the above description is also for illustration purposes. Various embodiments are not limited to a particular level when a signal is activated and/or deactivated. Selecting different logical values is within the scope of various embodiments.

In some embodiments, a circuit comprises a fuse circuit and a control circuit. The fuse circuit has an electrical fuse. The control circuit is configured 1) to receive an input signal and a feedback signal, the input signal having an input pulse 2) to provide a first output signal and a second output signal, the first output signal having a first output signal pulse 3) to generate a first edge of the first output signal based on a first edge of the input pulse and 4) to generate a second edge of the first output signal based on the feedback signal. The fuse circuit is configured 1) to receive the first output signal and the second output signal 2) to generate a read current to the electrical fuse for a duration of the first output signal pulse 3) to generate a fuse signal indicative of a program condition of the electrical fuse and 4) to generate a first logical value of the feedback signal based on a first logical value of the second output signal 5) to generate a second logical value of the feedback signal based on the fuse signal and 6) to provide the feedback signal.

In some embodiments, a circuit comprises a control circuit, an electrical fuse, and a transistor. The control circuit is configured to receive an input signal having an input pulse and generate a control output signal having a control output pulse that is smaller than the input pulse. The transistor has a first terminal, a second terminal, and a third terminal. The first terminal is configured to receive the control output signal. The second terminal is coupled to the electrical fuse. The third terminal is configured to provide a program condition of the electrical fuse. The control circuit is configured to generate a first edge of the control output pulse based on a first edge of the input signal, and configured to generate a second edge of the control output pulse based on the program condition of the electrical fuse.

In some embodiments, a first pulse of a first signal is provided, the first pulse having a first logical value of the first pulse and a second logical value of the first pulse. A second pulse of a second signal is generated. The second pulse is smaller than the first pulse, and has a first logical value of the second pulse and a second logical value of the second pulse. The first logical value of the second pulse is maintained until the first signal changes from the first logical value of the first pulse to the second logical value of the first pulse. The second pulse is used in a read operation of an electrical fuse. A transition of a first edge of the first pulse causes a transition of a first edge of the second pulse.

In some embodiments, a first pulse of a first signal is provided. A first edge of a second pulse of a second signal is generated based on a first edge of the first pulse. A first logical value of an electrical fuse is reflected at a first node in response to a transition of the first edge of the second pulse. A first edge of a third signal is generated based on the first logical value of the electrical fuse reflected at the first node. A second edge of the second pulse is generated based on the first edge of the third signal. A second edge of the third signal is generated based on a second edge of the first pulse. The second signal follows the first signal or an inverse of the first signal when the third signal is at a first logical value of the third signal. The second signal is forced to a first logical value of the second signal when the third signal is at a second logical value of the third signal.

The above methods show exemplary steps, but the steps are not necessarily performed in the order shown. Steps may be added, replaced, changed order, and/or eliminated as appropriate, in accordance with the spirit and scope of disclosed embodiments.

What is claimed is:

1. A circuit comprising:
   a fuse circuit having an electrical fuse; and
   a control circuit,
   wherein
      the control circuit is configured
         to receive an input signal and a feedback signal, the input signal having an input pulse,
         to provide a first output signal and a second output signal, the first output signal having a first output signal pulse,
         to generate a first edge of the first output signal based on a first edge of the input pulse, and
         to generate a second edge of the first output signal based on the feedback signal; and
      the fuse circuit is configured
         to receive the first output signal and the second output signal,
         to generate a read current to the electrical fuse for a duration of the first output signal pulse,
         to generate a fuse signal indicative of a program condition of the electrical fuse,
         to generate a first logical value of the feedback signal based on a first logical value of the second output signal,
         to generate a second logical value of the feedback signal based on the fuse signal, and
         to provide the feedback signal.

2. The circuit of claim 1, wherein
the control circuit includes a first inverter, a second inverter, a NAND gate, and a third inverter;
a first input of the first inverter is configured to receive the input signal;
a second input of the second inverter is configured to receive a first output of the first inverter;
the first output of the first inverter is configured to provide the second output signal;
a first gate input of the NAND gate is configured to receive a second output of the second inverter;
a second gate input of the NAND gate is configured to receive the feedback signal;
a third input of the third inverter is configured to receive a gate output of the NAND gate; and
a third output of the third inverter is configured to provide the first output signal.

3. The circuit of claim 1
the control circuit includes a first inverter, a NOR gate, and a second inverter;
a first input of the first inverter is configured to receive the input signal;
a first gate input of the NOR gate is configured to receive a first output of the first inverter;
a second gate input of the NOR gate is configured to receive the feedback signal;
a second input of the second inverter is configured to receive a gate output of the NOR gate; and
a second output of the second inverter is configured to provide the first output signal.

4. The circuit of claim 1, wherein the control circuit is configured such that
a logical value of the first output signal follows a logical value of the input signal or follows an inverse logical value of the input signal when the feedback signal is at a first logical value of the feedback signal; and
the first output signal is forced to a first logical value of the first output signal when the feedback signal is at a second logical value of the feedback signal.

5. The circuit of claim 1, wherein the control circuit is configured such that the second output signal is an inverse logic of the input signal.

6. The circuit of claim 1, wherein the control circuit is configured such that the second output signal is electrically the same as the input signal.

7. The circuit of claim 1, wherein the control circuit is configured such that the first output signal pulse is smaller than the input pulse.

8. The circuit of claim 1, wherein
the fuse circuit includes a first transistor;
a first terminal of the first transistor is configured to receive the fuse signal and to receive the read current;
a second terminal of the first transistor is coupled to the electrical fuse; and
a third terminal of the first transistor is configured to receive the first output signal.

9. The circuit of claim 8, wherein
the first terminal of the first transistor is coupled to a current source configured to sink or source the read current; and
the fuse circuit is configured to use the fuse signal at the first terminal of the first transistor to generate the first logical value and the second logical value of the feedback signal.

10. The circuit of claim 9, wherein
the fuse circuit further includes a second transistor, a third transistor, and a fourth transistor;
a first terminal of the second transistor is configured to receive the fuse signal;
a second terminal of the second transistor is configured to receive the second output signal;
a first terminal of the third transistor is configured to receive the fuse signal;
a second terminal of the third transistor and a first terminal of the fourth transistor form a node; and
the fuse circuit is configured to use a signal at the node to provide the feedback signal.

11. The circuit of claim 10, wherein
the fuse circuit further includes a fifth transistor and a biasing circuit;
the biasing circuit is configured to provide a first biasing signal and a second biasing signal;
a first terminal of the fifth transistor is configured to receive the first biasing signal;
a second terminal of the fifth transistor is configured to receive the fuse signal; and
a second terminal of the fourth transistor is configured to receive the second biasing signal.

12. The circuit of claim 11, wherein
the first transistor is an N-type Metal-Oxide Semiconductor (NMOS) transistor;
the second transistor is an NMOS transistor;
the third transistor is a P-type Metal-Oxide Semiconductor (PMOS) transistor;
the fourth transistor is an NMOS transistor; and
the fifth transistor is a PMOS transistor.

13. The circuit of claim 11, wherein
the first transistor is a PMOS transistor;
the second transistor is a PMOS transistor;
the third transistor is a PMOS transistor;
the fourth transistor is an NMOS transistor; and
the fifth transistor is an NMOS transistor.

14. The circuit of claim 1, further comprising an output circuit configured to receive the feedback signal and the second output signal, and provide a circuit output signal indicative of the program condition of the electrical fuse.

15. The circuit of claim 14, wherein
the control circuit is configured to further provide a third output signal; and
the output circuit is configured to further receive the third output signal.

16. A circuit comprising
a control circuit configured to receive an input signal having an input pulse and generate a control output signal having a control output pulse that is smaller than the input pulse;
an electrical fuse; and
a transistor having
a first terminal configured to receive the control output signal,
a second terminal coupled to the electrical fuse, and
a third terminal configured to provide a node signal indicating a program condition of the electrical fuse,
wherein the control circuit is configured to
generate a first edge of the control output pulse based on a first edge of the input signal;
generate a first edge of the node signal based on the first edge of the control output pulse and the program condition of the electrical fuse; and
generate a second edge of the control output pulse based on the first edge of the node signal.

17. The circuit of claim 16, wherein
the circuit further includes a first subcircuit configured to generate a feedback signal based on the program condition of the electrical fuse;
the control circuit is configured to receive the feedback signal to generate the second edge of the control output pulse.

18. The circuit of claim 17, wherein
the control circuit is configured such that the control output signal follows the input signal or follows an inverse logic of the input signal when the feedback signal is at a first logical value of the feedback signal, and the control output signal is at a first logical value of the control output signal when the feedback signal is at a second logical value of the feedback signal.

19. The circuit of claim 18, wherein the first subcircuit is configured to generate a first edge of the feedback signal based on the program condition of the electrical fuse, and generate a second edge of the feedback signal based on a second edge of the input signal.

20. The circuit of claim 16 further comprising a current source configured to sink or source a read current at the third terminal.

21. A method comprising:
providing a first pulse of a first signal, the first pulse having a first logical value of the first pulse and a second logical value of the first pulse;
generating a node signal based on the first signal and a program condition of an electrical fuse;
generating a second pulse of a second signal, the second pulse smaller than the first pulse, and having a first logical value of the second pulse and a second logical value of the second pulse; and
maintaining the first logical value of the second pulse until the first signal changes from the first logical value of the first pulse to the second logical value of the first pulse, wherein
the second pulse is used in a read operation of the electrical fuse;
the generating the second pulse of the second signal comprises causing a first transition of the second pulse based on a first transition of the first pulse, the first transition of the second pulse being from the first logical value to the second logical value of the second pulse;
the generating the node signal comprises causing a first transition of the node signal based on the first transition of the second pulse and the program condition of the electrical fuse; and
the generating the second pulse of the second signal further comprises causing a second transition of the second pulse based on the first transition of the node signal, the second transition of the second pulse being from the second logical level to the first logical value of the second pulse.

22. The method of claim 21, wherein
the first transition of the node signal causes a first logical value of a third signal;
the first logical value of the third signal causes the second transition of the second pulse; and
a second transition of the first pulse causes a second logical value of the third signal;
the second signal follows the first signal or follows an inverse logic of the first signal when the third signal is at the second logical value of the third signal; and
the second signal is forced to the first logical value of the second signal when the third signal is at the first logical value of the third signal.

23. The method of claim 21, wherein
a first terminal of a transistor serves to indicate the program condition of the electrical fuse;
a second terminal of the transistor is coupled to the electrical fuse; and
a third terminal of the transistor is applied with the second pulse.

24. A method comprising:
based on a first edge of a first pulse of a first signal, generating a first edge of a second pulse of a second signal;
reflecting a first logical value of an electrical fuse at a first node, in response to a transition of the first edge of the second pulse;
generating a first edge of a third signal based on the first logical value of the electrical fuse at the first node;
generating a second edge of the second pulse based on the first edge of the third signal; and
generating a second edge of the third signal based on a second edge of the first pulse,
wherein
the second signal follows the first signal or follows an inverse logic of the first signal when the third signal is at a first logical value of the third signal; and
the second signal is forced to a first logical value of the second signal when the third signal is at a second logical value of the third signal.

* * * * *